US012622148B2

(12) United States Patent
Lan et al.

(10) Patent No.: US 12,622,148 B2
(45) Date of Patent: May 5, 2026

(54) PIXEL STRUCTURE AND DISPLAY PANEL

(71) Applicant: Hefei Visionox Technology Co., Ltd., Hefei (CN)

(72) Inventors: Lan Lan, Hefei (CN); Yi Qu, Hefei (CN); Shaoya Qiu, Hefei (CN); Dandan Feng, Hefei (CN); Menghua Kang, Hefei (CN); Qingqing Dong, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 788 days.

(21) Appl. No.: 17/860,444

(22) Filed: Jul. 8, 2022

(65) Prior Publication Data

US 2022/0344414 A1 Oct. 27, 2022

Related U.S. Application Data

(63) Continuation of application No. PCT/CN2021/095675, filed on May 25, 2021.

(30) Foreign Application Priority Data

Jul. 31, 2020 (CN) .......................... 202010757027.0

(51) Int. Cl.
*H10K 59/35* (2023.01)

(52) U.S. Cl.
CPC ......... *H10K 59/353* (2023.02); *H10K 59/351* (2023.02); *H10K 59/352* (2023.02)

(58) Field of Classification Search
CPC .... H10K 59/351; H10K 59/352; H10K 59/10; H10K 59/35–353; H10K 59/121–1216;
(Continued)

(56) References Cited

U.S. PATENT DOCUMENTS 9,312,312 B1    4/2016 Tsai et al.
2009/0309821 A1    12/2009 Tanno
(Continued)

FOREIGN PATENT DOCUMENTS

CN    105957877 A    9/2016
CN    107706213 A  *  2/2018    ........... H10K 59/353
(Continued)

OTHER PUBLICATIONS

International Search Report (With English Translation) issued on Aug. 20, 2021 in corresponding International Application No. PCT/CN2021/095675; 12 pages.
(Continued)

*Primary Examiner* — Steven B Gauthier
*Assistant Examiner* — Adam D Weiland
(74) *Attorney, Agent, or Firm* — Maier & Maier, PLLC

(57) ABSTRACT

A pixel structure and a display panel, the pixel structure includes a plurality of repeating units arranged repeatedly, each of the repeating units includes a first sub-pixel, a second sub-pixel, a third sub-pixel and a fourth sub-pixel adjacent to each other in sequence, wherein an imagined first center connection line connecting a center of the first sub-pixel and a center of the second sub-pixel and an imagined third center connection line connecting a center of the third sub-pixel and a center of the fourth sub-pixel are located on one side of an imagined second center connection line connecting the center of the second sub-pixel and the center of the third sub-pixel, a minimum distance between the first sub-pixel and the fourth sub-pixel is greater than a minimum distance between the second sub-pixel and the third sub-pixel; a light-transmitting portion located between adjacent repeating units.

12 Claims, 8 Drawing Sheets

(58) Field of Classification Search
CPC ..... G09G 2300/0452; G09G 2300/0443–0447
See application file for complete search history.

(56) References Cited

U.S. PATENT DOCUMENTS

| | | | | |
|---|---|---|---|---|
| 2016/0372020 A1* | 12/2016 | Jin | ........................... | G09G 3/20 |
| 2020/0058713 A1* | 2/2020 | Zhang | ................. | H10K 59/353 |
| 2021/0359034 A1* | 11/2021 | Shi | ....................... | H10K 59/353 |

FOREIGN PATENT DOCUMENTS

| | | | | | |
|---|---|---|---|---|---|
| CN | 108510891 A | * | 9/2018 | ............. | G09F 9/302 |
| CN | 105957877 B | * | 8/2019 | .......... | H01L 27/3211 |
| CN | 110098240 A | | 8/2019 | | |
| CN | 110323259 A | | 10/2019 | | |
| CN | 110459574 A | * | 11/2019 | | |
| CN | 111383542 A | | 7/2020 | | |
| CN | 111863924 A | | 10/2020 | | |

OTHER PUBLICATIONS

Office Action issued on Jul. 6, 2021, in connection with corresponding Chinese Application No. 202010757027.0 (12 pp., including machine-generated English translation).

* cited by examiner

DA          NA

1000

1000

PIXEL STRUCTURE AND DISPLAY PANEL

CROSS-REFERENCE TO RELATED APPLICATIONS

This application is a continuation of International Application No. PCT/CN2021/095675 filed on May 25, 2021, which claims the priority to Chinese patent application No. 202010757027.0 filed on Jul. 31, 2020 and titled "PIXEL STRUCTURE AND DISPLAY PANEL", both of which are incorporated herein by reference in their entireties.

TECHNICAL FIELD

This application relates to the field of display, and particularly to a pixel structure and a display panel.

BACKGROUND

With a rapid development of electronic devices, users have higher and higher requirements for screen-to-body ratios, such that the industry has shown more and more interest in all-screen displays of electronic devices.

There is a need for traditional electronic devices, such as mobile phones and tablets, to have front-facing cameras, earpieces, and infrared sensing components etc. integrated thereon. In the prior art, notches or holes may be provided on display screens, so that external light can enter photosensitive elements under the screens through the notches or holes on the screens. However, these electronic devices do not have actual all-screen displays, since not all regions across the screens can be used to display, for example, regions corresponding to front-facing cameras cannot be used to display pictures.

SUMMARY

Embodiments of the present application provide a pixel structure and a display panel, enabling at least a part of regions of the display panel to be light-transmitting and display.

In one aspect, embodiments of the present application provide a pixel structure, includes: a plurality of repeating units arranged repeatedly, each of the repeating units includes a first sub-pixel, a second sub-pixel, a third sub-pixel and a fourth sub-pixel, wherein the first sub-pixel, the second sub-pixel, the third sub-pixel and the fourth sub-pixel are adjacent to each other in sequence, wherein a center of the first sub-pixel and a center of the second sub-pixel are connected by an imagined first center connection line, the center of the second sub-pixel and a center of the third sub-pixel are connected by an imagined second center connection line, and the center of the third sub-pixel and a center of the fourth sub-pixel are connected by an imagined third center connection line, the imagined first center connection line and the imagined third center connection line are located on one side of the imagined second center connection line, and a minimum distance between the first sub-pixel and the fourth sub-pixel is greater than a minimum distance between the second sub-pixel and the third sub-pixel; and a light-transmitting portion located between adjacent repeating units.

In another aspect, embodiments of the present application provide a display panel including the pixel structure according to any of the above implementations.

According to the pixel structure of the embodiments of the present application, in each of the repeating units, the imagined first center connection line and the imagined third center connection line are located on one side of the imagined second center connection line, and the minimum distance between the first sub-pixel and the fourth sub-pixel is larger than the minimum distance between the second sub-pixel and the third sub-pixel, so that the first sub-pixel, the second sub-pixel, the third sub-pixel and the fourth sub-pixel are arranged adjacent to each other in sequence to form a roughly C-shaped semi-surrounding structure, in which the area semi-enclosed by the first sub-pixel, the second sub-pixel, the third sub-pixel and the fourth sub-pixel can be used to configure the light-transmitting portion, with enough space reserved to dispose the light-transmitting portion in the pixel structure after the sub-pixels are arranged, the light transmittance of the display panel including the pixel structure can be improved. When the repeating units are arranged in a preset regularity, the light-transmitting portions between the repeating units are also distributed regularly and relatively evenly, so that the light which can be transmitted through the display panel including the pixel structure is distributed more uniformly, which is convenient to applied in light-transmitting display technology or under-screen photosensitive element integration technology.

BRIEF DESCRIPTION OF THE DRAWINGS

Other features, objects and advantages of the present application will become more apparent upon reading the following detailed description of non-limiting embodiments with reference to the accompanying drawings, wherein the same or similar reference signs indicate the same or similar features and the accompanying drawings are not drawn to actual scale.

DETAILED DESCRIPTION

Features and exemplary embodiments of various aspects of the present application will be described in detailed below. In order to make the objects, technical solutions and advantages of the present application clearer, the present application is further described in details below with reference to the accompany drawings and specific embodiments. It should be understood that the specific embodiments described herein are only for illustration of the present application, and are not for limiting the present application. For those skilled in the art, the present application can be implemented without some of those specific details. The below description of embodiments is only for providing better understanding of the present application by showing examples of the present application.

It should be noted that, in the present application, relational terms such as first and second are used only to distinguish one entity or operation from another entity or operation, and do not necessarily require or imply any such actual relationship or sequence exists between these entities or operations.

Figure 1:
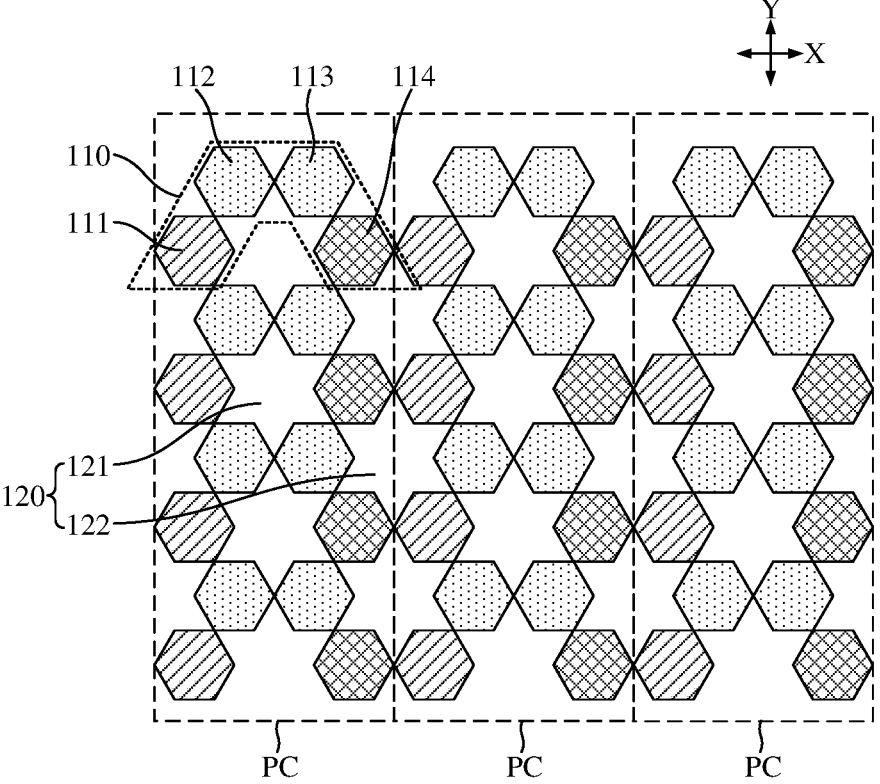
FIG. 1 is a schematic structural diagram of a pixel structure provided according to a first embodiment of the present application.

An embodiment of the present application provides a pixel structure. FIG. 1 is a schematic structural diagram of a pixel structure provided according to a first embodiment of the present application. The pixel structure of the embodiment of the present application includes a plurality of repeating units arranged repeatedly.

Figure 2:
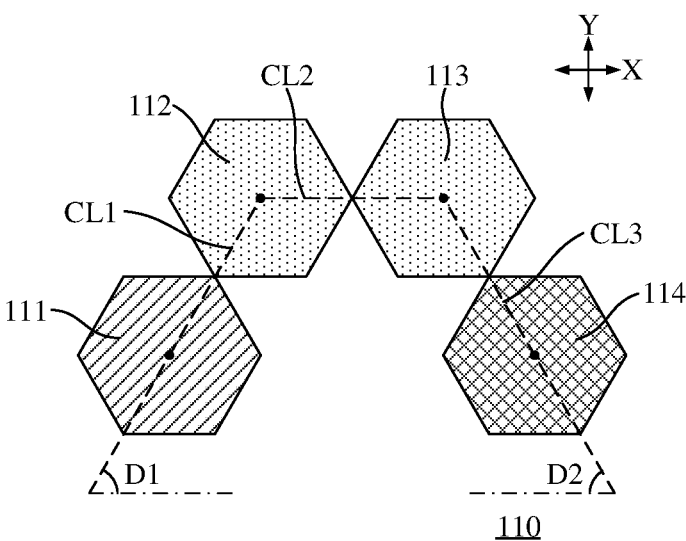
FIG. 2 is a schematic structural diagram of a repeating unit in the pixel structure provided according to the first embodiment of the present application.

FIG. 2 is a schematic structural diagram of a repeating unit in the pixel structure provided according to the first embodiment of the present application, each of the repeating units 110 includes a first sub-pixel 111, a second sub-pixel 112, a third sub-pixel 113 and a fourth sub-pixel 114. The first sub-pixel 111, the second sub-pixel 112, the third sub-pixel 113 and the fourth sub-pixel 114 are adjacent to each other in sequence. A center of the first sub-pixel 111 and a center of the second sub-pixel 112 are connected by an imagined first center connection line CL1, the center of the second sub-pixel 112 and a center of the third sub-pixel 113 are connected by an imagined second center connection line CL2, and the center of the third sub-pixel 113 and a center of the fourth sub-pixel 114 are connected by an imagined third center connection line CL3. The imagined first center connection line CL1 and the imagined third center connection line CL3 are located on one side of the imagined second center connection line CL2, and a minimum distance between the first sub-pixel 111 and the fourth sub-pixel 114 is greater than a minimum distance between the second sub-pixel 112 and the third sub-pixel 113.

The pixel structure of the embodiment of the present application further includes a light-transmitting portion 120, wherein the light-transmitting portion 120 is located between adjacent repeating units 110.

According to the pixel structure of the embodiment of the present application, in each of the repeating units 110, the imagined first center connection line CL1 and the imagined third center connection line CL3 are located on one side of the imagined second center connection line CL2, and the minimum distance between the first sub-pixel 111 and the fourth sub-pixel 114 is greater than the minimum distance between the second sub-pixel 112 and the third sub-pixel 113, so that the first sub-pixel 111, the second sub-pixel 112, the third sub-pixel 113 and the fourth sub-pixel 114 are arranged in sequence to form a roughly C-shaped semi-enclosed structure, wherein the area semi-enclosed by the first sub-pixel 111, the second sub-pixel 112, the third sub-pixel 113 and the fourth sub-pixel 114 can be used to configure the light-transmitting portion 120, with enough space reserved to dispose the light-transmitting portion 120 in the pixel structure after the sub-pixels are arranged, the light transmittance of the display panel including the pixel structure can be improved. When the repeating units 110 are arranged in a preset regularity, the light-transmitting portions 120 between the repeating units 110 are also distributed regularly and relatively evenly, so that the light which can be transmitted through the display panel including the pixel structure is distributed more uniformly, which is convenient to be applied in light-transmitting display technology or under-screen photosensitive element integration technology.

In some embodiments, the colors of the second sub-pixel 112 and the third sub-pixel 113 are the same, and the colors of the first sub-pixel 111, the second sub-pixel 112 and the fourth sub-pixel 114 are different from each other, so that each of the repeating units 110 includes the sub-pixels of three colors, which can be used to display three primary colors and satisfy the display effect.

The pixel structure of the embodiments of the present application may be used in an Organic Light Emitting Diode (OLED) display panel or a display device, wherein the first sub-pixel 111, the second sub-pixel 112, the third sub-pixel 113 and the fourth sub-pixel 114 may be OLED light emitting elements. When each sub-pixel is an OLED light-emitting element, it includes a plurality of organic film layers, and at least some of the organic film layers can be formed by an evaporation process.

In the above embodiment, in each of the repeating units 110, the second sub-pixel 112 is connected to the third sub-pixel 113 and has the same color as the third sub-pixel 113, so that at least some of the film layers of the second sub-pixel 112 and the third sub-pixel 113 can be formed by evaporation through the opening of a same mask plate, which can reduce process pressure of the mask plate, reduce the requirement for the fineness of the openings of the mask plate, and thus reduce the production cost.

As mentioned above, the colors of the first sub-pixel 111 and the fourth sub-pixel 114 are different. When the repeating units 110 are arranged in a preset regularity, the first sub-pixels 111 and the fourth sub-pixels 114 are also arranged in a preset regularity, that is, the arrangement regularity of the first sub-pixels 111 is the same as that of the fourth sub-pixels 114.

In some embodiments, the shapes of the first sub-pixels 111 and the fourth sub-pixels 114 are the same, and since the arrangement regularity of the first sub-pixels 111 is the same as that of the fourth sub-pixels 114, therefore, a same mask plate can be used to form the first sub-pixels 111 and the fourth sub-pixels 114 by evaporation, which can save the cost of the mask plate in the process of forming the pixel structure.

Each of the repeating units 110 includes sub-pixels of three colors. In some embodiments, the sub-pixels of the three colors are a red sub-pixel, a green sub-pixel, and a blue sub-pixel, respectively. Optionally, the second sub-pixel 112 and the third sub-pixel 113 are both green sub-pixels; one of the first sub-pixel 111 and the fourth sub-pixel 114 is a red sub-pixel, and the other is a blue sub-pixel, for example, in this embodiment, the first sub-pixel 111 is a red sub-pixel, and the fourth sub-pixel 114 is a blue sub-pixel.

In some embodiments, the imagined second center connection line CL2 is parallel to the first direction X, the first sub-pixel 111 and the fourth sub-pixel 114 are located on the same side of the second sub-pixel 112 and the third sub-pixel 113 along the second direction, the second direction Y is perpendicular to the first direction X. In this embodiment, an acute angle D1 formed between the imagined first center connection line CL1 and the first direction X is equal to an acute angle D2 formed between the imagined third center connection line CL3 and the first direction X, so that the first sub-pixel 111, the second sub-pixel 11, the third sub-pixel 113 and the fourth sub-pixel 114 are arranged to form an axisymmetric semi-enclosed structure.

According to the pixel structure of the above embodiment, in each of the repeating units 110, the first sub-pixel 111 and the second sub-pixel 112 form a first color light-emitting unit, and the third sub-pixel 113 and the fourth sub-pixel 114 form a second color light-emitting unit. The first color light-emitting unit includes a red sub-pixel and a green sub-pixel. When displaying a picture, the missing blue sub-pixel in the three primary colors can be borrowed from the second color light-emitting unit which is adjacent to the first color light-emitting unit; the second color light-emitting unit includes a blue sub-pixel and a green sub-pixel, when displaying a picture, the missing red sub-pixel in the three primary colors can be borrowed from the first color light-emitting unit which is adjacent to the second color light-emitting unit. Therefore, when the pixel structure displays a picture, the color rendering degree is higher, and the pixel density (Pixels Per Inch, PPI) of the pixel structure is improved through the borrowing arrangement of the sub-pixels.

The change of the acute angle D1 formed between the imagined first center connection line CL1 and the first direction X, and the change of the acute angle D2 formed between the imagined third center connection line CL3 and the first direction X will affect the spacing between the arrays of the repeating units 110 in the first direction X and the second direction Y. In this embodiment, the acute angle D1 formed between the imagined first center connection line CL1 and the first direction X is equal to the acute angle D2 formed between the imagined third center connection line CL3 and the first direction X, preferably, the acute angle D1 formed between the imagined first center connection line CL1 and the first direction X ranges from 30 degrees to 60 degrees, for example, the acute angle D1 in this embodiment is 60 degrees. By setting the acute angle D1 and the acute angle D2 at an angle ranges from 30 degrees to 60 degrees, the spacing between the rows of the pixels, the spacing between the columns of the pixels and the spacing between the repeating units 110 in the pixel structure will be relatively uniform, and when displaying, the proportional relationship between rows and columns is not easily distorted.

Referring to FIG. 1 and FIG. 2, in some embodiments, the plurality of repeating units 110 are arranged along the second direction Y to form a pixel column PC, and a plurality of pixel columns PC are arranged along the first direction X.

The light-transmitting portion 120 includes a first sub-light transmitting portion 121 and a second sub-light transmitting portion 122. The first sub-light transmitting portion 121 is located between every adjacent repeating units 110 in a pixel column PC. The second sub-light transmitting portion 122 is located between adjacent pixel columns PC.

According to the pixel structure of the above-mentioned embodiment, when the repeating units 110 are regularly arranged in the first direction X and the second direction Y respectively, the light-transmitting portion 120 is distributed more uniformly in the pixel structure in the form of the first sub-light transmitting portion 121 and the second sub-light transmitting portion 122, so that light can pass through the display panel including the pixel structure more uniformly, which is convenient for integrating array-type photosensitive elements on the back of the display panel.

As shown in FIG. 1, in the first embodiment, in each pixel column PC, the adjacent repeating units 110 are connected to each other. In every two adjacent repeating units 110 in the pixel column PC, the second sub-pixel 112 of one repeating unit 110 is arranged adjacent to the first sub-pixel 111 of the other repeating unit 110, and the third sub-pixel 113 of the one repeating unit 110 is arranged adjacent to the fourth sub-pixel 114 of the other repeating unit 110. For example, in this embodiment, in each pixel column PC, the second sub-pixel 112 of one repeating unit 110 is arranged adjacent to the first sub-pixel 111 of a previous repeating unit 110 of the one repeating unit 110, and the third sub-pixel 113 of the one repeating unit 110 is arranged adjacent to the fourth sub-pixel 114 of the previous repeating unit 110, so that the repeating units 110 in each pixel column PC are closely arranged, which is convenient to improve the PPI of the pixel structure. In addition, the adjacent repeating units 110 in each pixel column PC are connected to each other, so that the edges of the first sub-light transmitting portion 121 between the adjacent repeating units 110 in each pixel column PC are closed, and the first sub-light transmitting portions 121 have the same shape and are arranged regularly, thereby improving the distribution uniformity of the light transmitting portion 120 in the pixel structure.

As shown in FIG. 1, in the first embodiment, adjacent pixel columns PC are connected to each other. In every two adjacent pixel columns PC, the first sub-pixel 111 of one pixel column PC is arranged adjacent to the fourth sub-pixel 114 of the other pixel column PC, so that in the first direction X, the repeating units 110 are closely arranged, so as to improve the PPI of the pixel structure.

In addition, in the first embodiment, the adjacent repeating units 110 in each pixel column PC are connected to each other, and the adjacent pixel columns PC are connected to each other, so that the edges of the second sub-light transmitting portion 122 between adjacent pixel columns PC are closed, and the second sub-light transmitting portions 122 have the same shape and are arranged regularly, thereby improving the distribution uniformity of the light transmitting portion 120 in the pixel structure.

It should be noted that the arrangement of the repeating units 110 may not be limited to the situation in the first embodiment described above. In the first direction X and the second direction Y, the spacing distance between the repeating units 110 and the arrangement of the repeating units 110 will affect the pixel display ratio, PPI, and the proportion of the area of the light-transmitting portion 120. Therefore, according to actual usage requirements, the arrangement of the repeating units 110 in the first direction X and the second direction Y can be adjusted. The following second embodiment, third embodiment and fourth embodiment schematically illustrate several adjustment methods, wherein most of the structures of the second embodiment, third embodiment and fourth embodiment are the same as the first embodiment, and only the differences from the first embodiment will be described below, and the similarities will not be described in detail.

Figure 3:
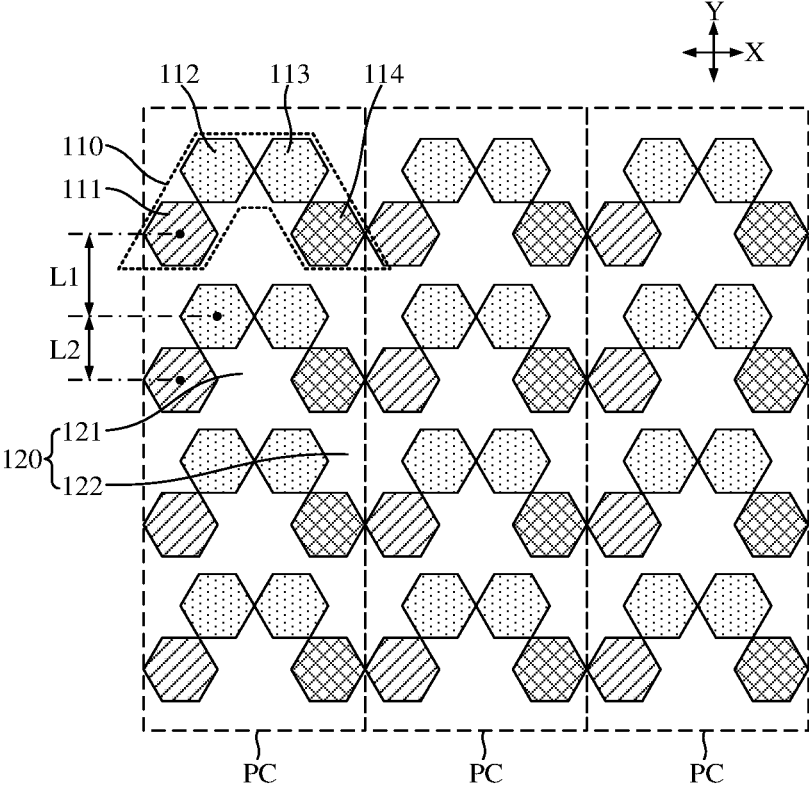
FIG. 3 is a schematic structural diagram of a pixel structure provided according to a second embodiment of the present application, wherein a plurality of repeating units are arranged along a second direction to form a pixel column, and a plurality of pixel columns are arranged along a first direction, and wherein adjacent repeating units in each pixel column are spaced apart from each other, and adjacent pixel columns are connected to each other.

FIG. 3 is a schematic structural diagram of a pixel structure provided according to a second embodiment of the present application. In the second embodiment, a plurality of repeating units 110 are arranged along the second direction Y to form a pixel column PC, and a plurality of pixel columns PC are arranged along the first direction X, wherein adjacent repeating units 110 in each of the pixel columns PC are spaced apart from each other, and adjacent pixel columns PC are connected to each other. Specifically, in every two adjacent pixel columns PC, the first sub-pixel 111 of one pixel column PC is arranged adjacent to the fourth sub-pixel 114 of the other pixel column PC.

In this embodiment, in each pixel column PC, the second sub-pixel 112 of one repeating unit 110 is arranged adjacent to the first sub-pixel 111 of a previous repeating unit 110 of the one repeating unit 110, and the third sub-pixel 113 of the one repeating unit 110 is arranged adjacent to the fourth sub-pixel 114 of the previous repeating unit 110. A distance between the center of the second sub-pixel 112 of the one repeating unit 110 and the center of the first sub-pixel 111 of the previous repeating unit 110 in a direction parallel to the second direction Y is a first distance L1. In each of the repeating units 110, a distance between the center of the second sub-pixel 112 and the center of the first sub-pixel 111 in a direction parallel to the second direction Y is a second distance L2. In some embodiments, when the adjacent repeating units 110 in each pixel column PC are spaced apart from each other, the first distance L1 is less than or equal to twice the second distance L2, so that the area of the first sub-light transmitting portion 121 is increased to improve the light transmittance of the pixel structure, and meanwhile the spacing of the sub-pixels in the second direction Y is prevented from being too large, so as to avoid distortion in the second direction Y to a certain extent when the pixel structure displays the picture.

Figure 4:
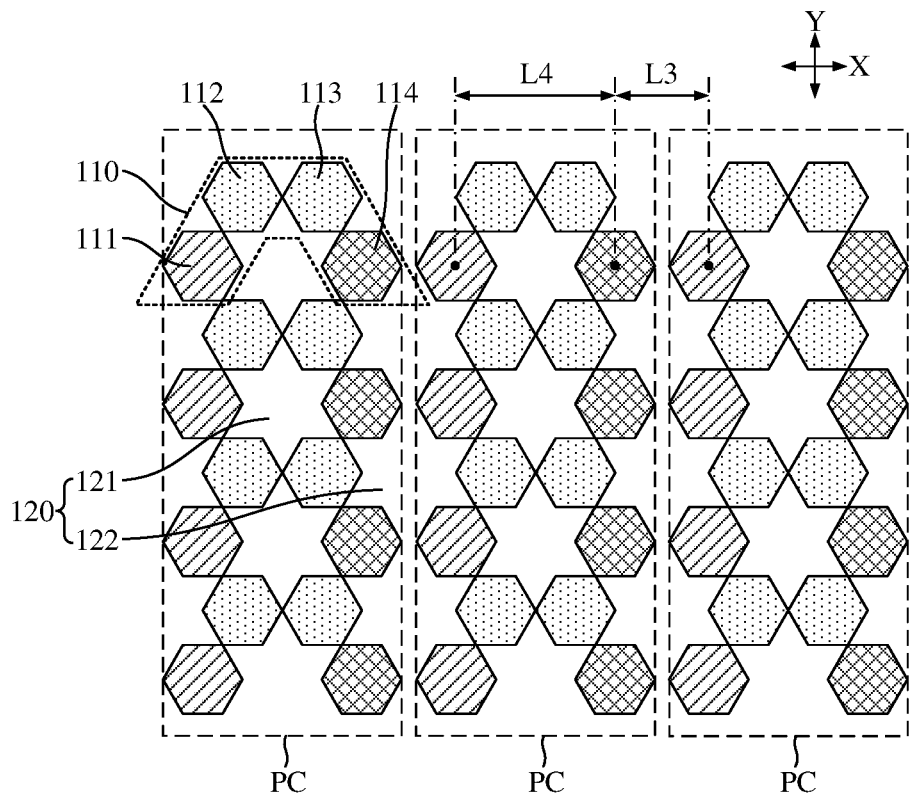
FIG. 4 is a schematic structural diagram of a pixel structure provided according to a third embodiment of the present application, wherein a plurality of repeating units are arranged along a second direction to form a pixel column, and a plurality of pixel columns are arranged along a first direction, and wherein adjacent repeating units in each pixel column are connected to each other, and adjacent pixel columns are spaced apart from each other.

FIG. 4 is a schematic structural diagram of a pixel structure provided according to a third embodiment of the present application. In the third embodiment, a plurality of repeating units 110 are arranged along the second direction Y to form a pixel column PC, and a plurality of pixel columns PC are arranged along the first direction X, wherein adjacent repeating units 110 in each of the pixel columns PC are connected to each other, and adjacent pixel columns PC are spaced apart from each other.

In this embodiment, in every two adjacent pixel columns PC, the first sub-pixel 111 of one pixel column PC is arranged adjacent to the fourth sub-pixel 114 of the other pixel column PC, for the first sub-pixel 111 and the fourth sub-pixel 114 which are adjacent to each other in the adjacent pixel columns PC, a distance between the center of the first sub-pixel 111 and the center of the fourth sub-pixel 114 in a direction parallel to the first direction X is a third distance L3. In each of the repeating units 110, a distance between the center of the first sub-pixel 111 and the center of the fourth sub-pixel 114 in a direction parallel to the first direction X is a fourth distance L4. In some embodiments, when the adjacent pixel columns PC are spaced apart from each other, the third distance L3 is less than or equal to the fourth distance L4, so that the area of the first sub-light transmitting portion 122 is increased to improve the light transmittance of the pixel structure, and meanwhile the spacing of the sub-pixels in the first direction X is prevented from being too large, so as to avoid distortion in the first direction X to a certain extent when the pixel structure displays the picture.

Figure 5:
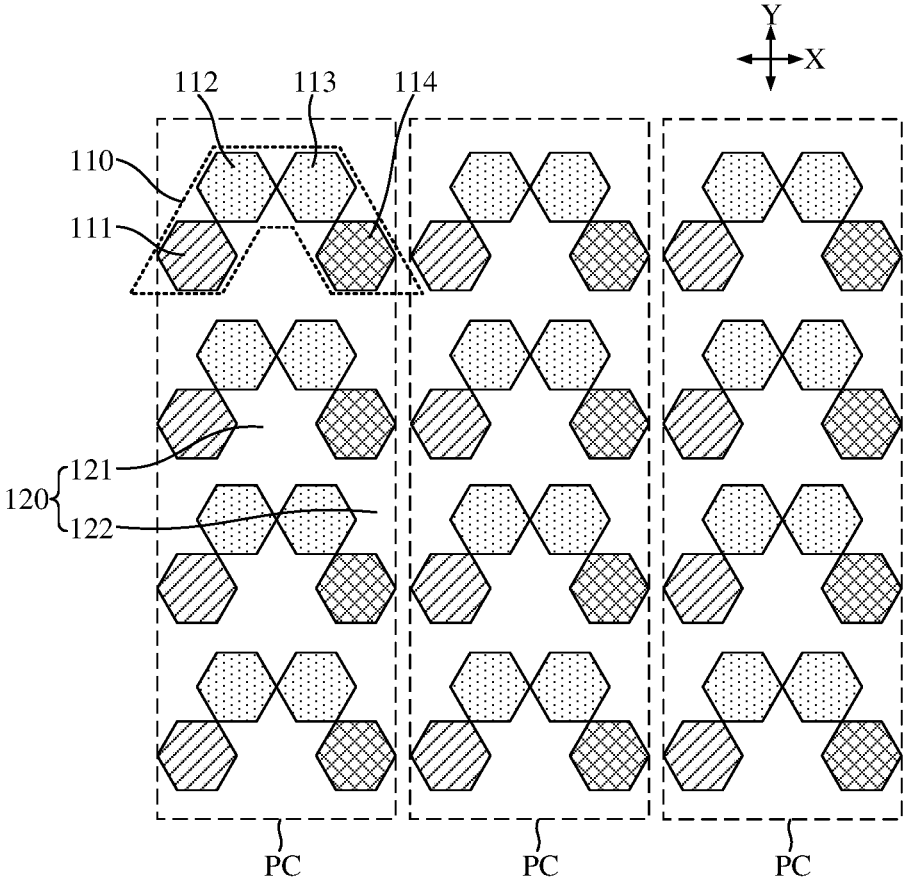
FIG. 5 is a schematic structural diagram of a pixel structure provided according to a fourth embodiment of the present application, wherein a plurality of repeating units are arranged along a second direction to form a pixel column, and a plurality of pixel columns are arranged along a first direction, and wherein adjacent repeating units in each pixel column are spaced apart from each other, and adjacent pixel columns are spaced apart from each other.

FIG. 5 is a schematic structural diagram of a pixel structure provided according to a fourth embodiment of the present application. In the fourth embodiment, a plurality of repeating units 110 are arranged along the second direction Y to form a pixel column PC, and a plurality of pixel columns PC are arranged along the first direction X, wherein adjacent repeating units 110 in each pixel column PC are spaced apart from each other, and adjacent pixel columns PC are spaced apart from each other.

In the foregoing embodiments, the shapes of the first sub-pixel 111, the second sub-pixel 112, the third sub-pixel 113 and the fourth sub-pixel 114 are the same, so that the first color light-emitting unit and the second color light-emitting unit have uniform light-emitting colors during display, which ensures a high display effect of the pixel structure.

In this embodiment, the first sub-pixel 111, the second sub-pixel 112, the third sub-pixel 113 and the fourth sub-pixel 114 are respectively formed in polygon shapes. For example, in the foregoing embodiments, the first sub-pixel 111, the second sub-pixel 112, the third sub-pixel 113 and the fourth sub-pixel 114 are respectively formed in regular hexagon shapes. However, in some other embodiments, the sub-pixels may not be limited to be regular hexagon shapes, and may also be other polygons such as a triangle, a quadrilateral, and a pentagon. In addition, the angle of the acute angle D1 formed between the imagined first center connection line CL1 and the first direction X, and the angle of the acute angle D2 formed between the imagined third center connection line CL3 and the first direction X may not be limited to 60 degrees as described in the above embodiments. According to actual design and usage requirements, the shape of the sub-pixels and the angles of the acute angle D1 and the acute angle D2 can be adjusted accordingly. The following fifth and sixth embodiments schematically illustrate several adjustment methods. Most of the structures of the fifth and sixth embodiments are the same as those of the first embodiment, and only the differences from the first embodiment will be described below, and the similarities will not be described in detail.

Figure 6:
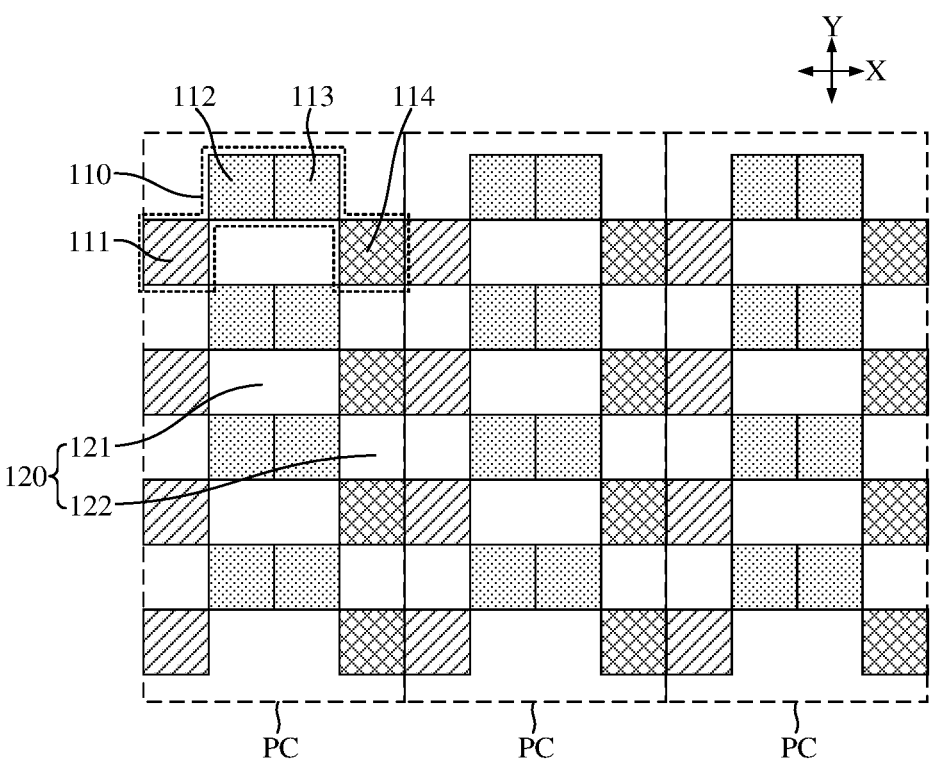
FIG. 6 is a schematic structural diagram of a pixel structure provided according to a fifth embodiment of the present application, wherein the acute angle between the first direction and the connection line between the first sub-pixel and the second sub-pixel is 45 degrees.
Figure 7:
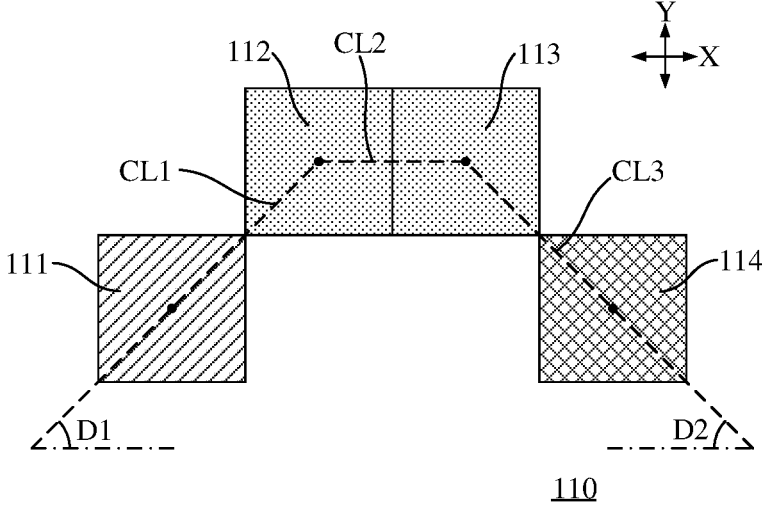
FIG. 7 is a schematic structural diagram of a repeating unit in the pixel structure provided according to the fifth embodiment of the present application.

FIG. 6 is a schematic structural diagram of a pixel structure provided according to a fifth embodiment of the present application, and FIG. 7 is a structural schematic diagram of a repeating unit in the pixel structure provided according to the fifth embodiment of the present application. In the fifth embodiment, the first sub-pixel 111, the second sub-pixel 112, the third sub-pixel 113 and the fourth sub-pixel 114 are respectively formed in square shapes.

The imagined second center connection line CL2 is parallel to the first direction X, the first sub-pixel 111 and the fourth sub-pixel 114 are located on the same side of the second sub-pixel 112 and the third sub-pixel 113 along the second direction Y which is perpendicular to the first direction X, and the acute angle D1 formed between the imagined first center connection line CL1 and the first direction X is equal to the acute angle D2 formed between the imagined third center connection line CL3 and the first direction X. In the fifth embodiment, the acute angle D1 formed between the first center line connection CL1 and the first direction X is 45 degrees.

Figure 8:
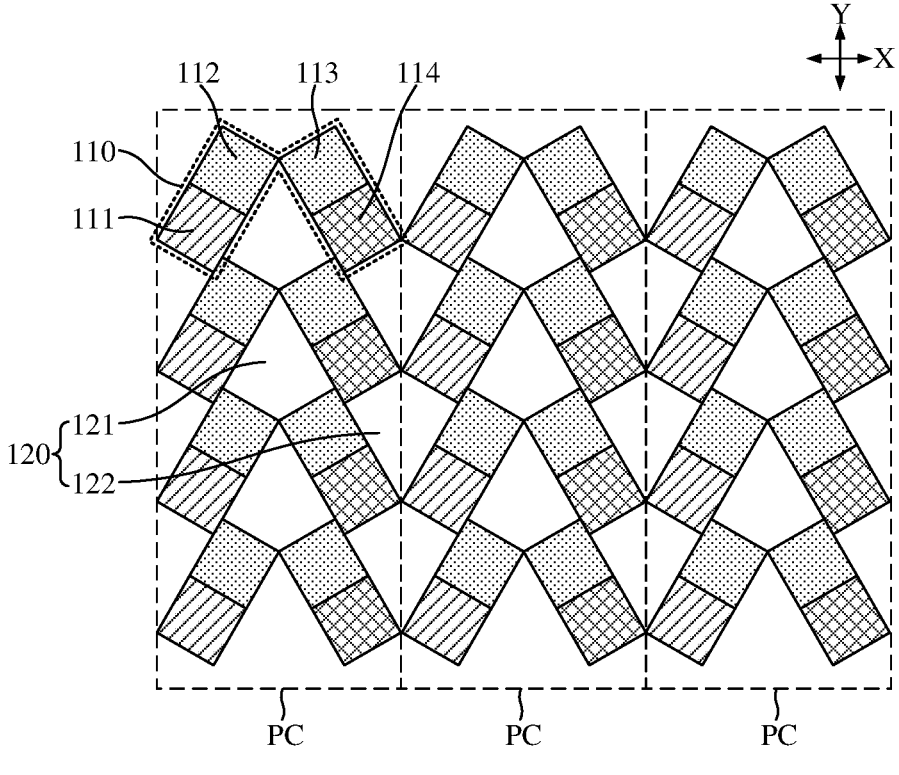
FIG. 8 is a schematic structural diagram of a pixel structure provided according to a sixth embodiment of the present application, wherein the acute angle between the first direction and the connection line between the first sub-pixel and the second sub-pixel is 60 degrees.
Figure 9:
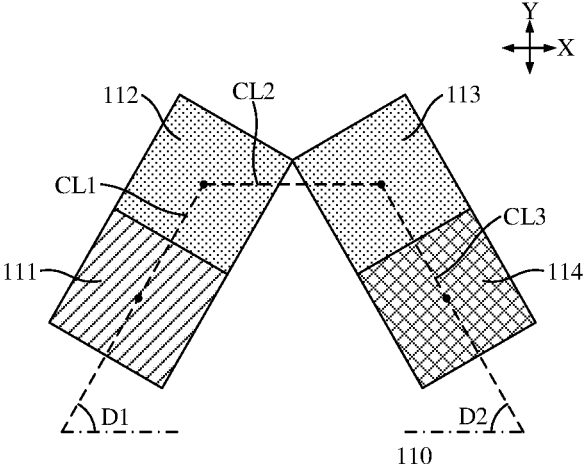
FIG. 9 is a schematic structural diagram of a repeating unit in the pixel structure provided according to the sixth embodiment of the present application.

FIG. 8 is a schematic structural diagram of a pixel structure provided according to a sixth embodiment of the present application, and FIG. 9 is a structural schematic diagram of a repeating unit in the pixel structure provided according to the sixth embodiment of the present application. In the sixth embodiment, the first sub-pixel 111, the second sub-pixel 112, the third sub-pixel 113 and the fourth sub-pixel 114 are respectively formed in square shapes.

The imagined second center connection line CL2 is parallel to the first direction X, the first sub-pixel 111 and the fourth sub-pixel 114 are located on the same side of the second sub-pixel 112 and the third sub-pixel 113 along the second direction Y which is perpendicular to the first direction X, and the acute angle D1 formed between the imagined first center connection line CL1 and the first direction X is equal to the acute angle D2 formed between the imagined third center connection line CL3 and the first direction X. In the sixth embodiment, the acute angle D1 formed between the imagined first center connection line CL1 and the first direction X is 60 degrees.

The shape of the sub-pixel is actually not limited to polygon, and in some other embodiments, the sub-pixel may also be other shapes such as a circle and an ellipse.

In some embodiments of the present application described above, the first sub-pixel 111, the second sub-pixel 112, the third sub-pixel 113 and the fourth sub-pixel 114 are respectively formed in polygon shapes, so that the uniformity of mask openings of the mask plate used in the formation of the first sub-pixel 111, the second sub-pixel 112, the third sub-pixel 113 and the fourth sub-pixel 114 by evaporation is better, which facilitates the formation of the sub-pixels.

In some embodiments of the present application described above, the acute angle D1 formed between the imagined first center connection line CL1 and the first direction X, and the acute angle D2 formed between the imagined third center connection line CL3 and the first direction X are respectively set to an angle ranges from 30 to 60 degrees, which enables the spacing between the rows of the repeating units 110 and the sub-pixels and the spacing between the columns of the repeating units 110 and the sub-pixels in the pixel structure being relatively uniform, and the proportional relationship of the rows and columns being not easily distorted during display.

Embodiments of the present application further provide a display panel, which includes the pixel structure according to any of the foregoing embodiments of the present application.

Figure 10:
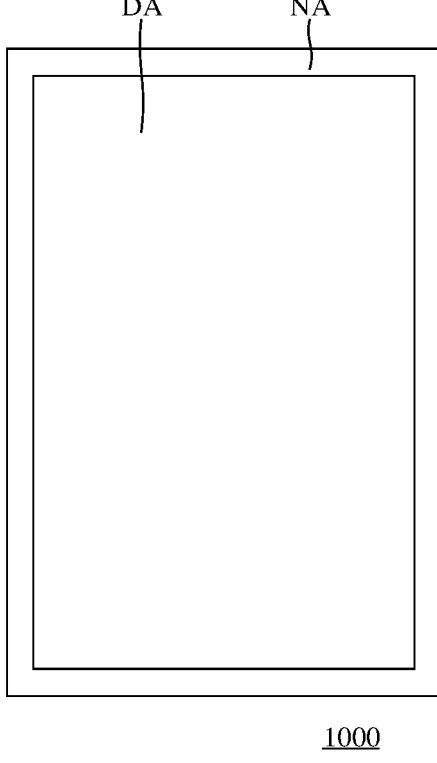
FIG. 10 is a schematic structural diagram of a display panel provided according to a first embodiment of the present application.

FIG. 10 is a schematic structural diagram of a display panel provided according to the first embodiment of the present application. In this embodiment, the display panel 1000 includes a display area (DA) and a non-display area (NA) surrounding the periphery of the display area DA. The pixel structure of any of the foregoing embodiments is arranged in the display area DA.

Figure 11:
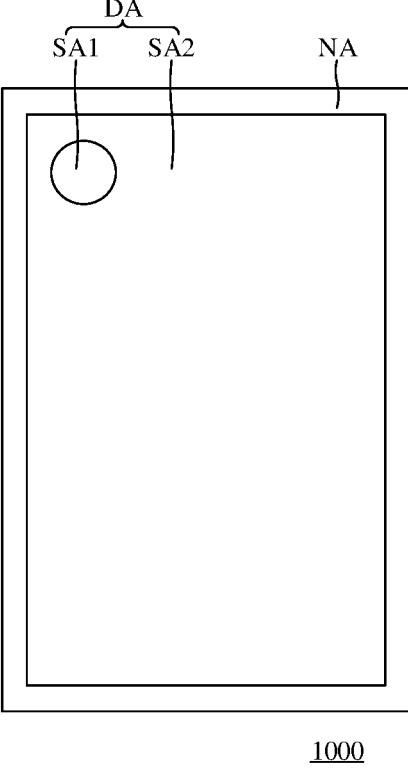
FIG. 11 is a schematic structural diagram of a display panel provided according to a second embodiment of the present application.

FIG. 11 is a schematic structural diagram of a display panel provided according to a second embodiment of the present application. In this embodiment, the display panel 1000 includes a display area DA and a non-display area NA surrounding the periphery of the display area DA, wherein the display area DA includes a first sub-display area SA1 and a second sub-display area SA2, the pixel structure of any of the foregoing embodiments is disposed in any one of the first sub-display area SA1 and the second sub-display area SA2.

In this embodiment, the first sub-display area SA1 is formed in a circular shape, the second sub-display area SA2 is arranged surrounding the periphery of the first sub-display area SA1, and the pixel structure of any of the foregoing embodiments is, for example, arranged in the first sub-display area SA1. It can be understood that the shape and interconnection of the first sub-display area SA1 and the second sub-display area SA2 may not be limited to the above examples. In other embodiments, the first sub-display area SA1 may be polygonal, elliptical and other shapes, or even is an odd shape, and the second sub-display area SA2 may surround the first sub-display area SA1, may half surround the first sub-display area SA1, or may be arranged adjacent to the first sub-display area SAL In some other embodiments, the pixel structure of any of the foregoing embodiments may be disposed in the second sub-display area SA2.

The pixel structure includes a plurality of repeating units 110 arranged repeatedly and a light-transmitting portion 120. Each of the repeating units 110 includes a first sub-pixel 111, a second sub-pixel 112, a third sub-pixel 113 and a fourth sub-pixel 114. The first sub-pixel 111, the second sub-pixel 112, the third sub-pixel 113 and the fourth sub-pixel 114 are adjacent to each other in sequence. A line connecting the center of the first sub-pixel 111 and the center of the second sub-pixel 112 is the imagined first center connection line CL1, a line connecting the center of the second sub-pixel 112 and the center of the third sub-pixel 113 is the imagined second center connection line CL2, and a line connecting the center of the third sub-pixel 113 and the center of the fourth sub-pixel 114 is the imagined third center connection line CL3. The imagined first center connection line CL1 and the imagined third center connection line CL3 are located on one side of the imagined second center connection line CL2, and a minimum distance between the first sub-pixel 111 and the fourth sub-pixel 114 is greater than a minimum distance between the second sub-pixel 112 and the third sub-pixel 113. The light-transmitting portion 120 is located between adjacent repeating units 110.

According to the display panel 1000 of the embodiments of the present application, in each of the repeating units 110, the imagined first center connection line CL1 and the imagined third center connection line CL3 are located on one side of the imagined second center connection line CL2, and the minimum distance between the first sub-pixel 111 and the fourth sub-pixel 114 is greater than the minimum distance between the second sub-pixel 112 and the third sub-pixel 113, so that the first sub-pixel 111, the second sub-pixel 112, the third sub-pixel 113 and the fourth sub-pixel 114 are arranged adjacent to each other in sequence to form a roughly C-shaped semi-surrounding structure, wherein the area semi-enclosed by the first sub-pixel 111, the second sub-pixel 112, the third sub-pixel 113 and the fourth sub-pixel 114 can be used to configure the light-transmitting portion 120, with enough space reserved to dispose the light-transmitting portion 120 in the pixel structure after the sub-pixels are arranged, the light transmittance of the display panel 1000 can be improved. When the repeating units 110 are arranged in a preset regularity, the light-transmitting portions 120 between the repeating units 110 are also distributed regularly and relatively evenly, so that the light which can be transmitted through the display panel 1000 is distributed more uniformly, which is convenient for implementing light-transmitting display of the display panel 1000 and under-screen photosensitive element integration of the display panel 1000.

In some embodiments, the colors of the second sub-pixel 112 and the third sub-pixel 113 are the same, and the colors of the first sub-pixel 111, the second sub-pixel 112, and the fourth sub-pixel 114 are different from each other, so that each repeating unit 110 includes sub-pixels of three colors, which can be used to display three primary colors and satisfy the display effect. The second sub-pixel 112 is connected to the third sub-pixel 113 and has the same color with the third sub-pixel 113, so that at least some of the film layers of the second sub-pixel 112 and the third sub-pixel 113 can be formed by evaporation through the opening of a same mask plate, which can reduce process pressure of the mask plate, reduce the requirement for the fineness of the openings of the mask plate, and thus reduce the production cost.

Taking the under-screen photosensitive element integration of the display panel 1000 as an example, the display panel 1000 includes a display surface and a non-display surface opposite to each other. The photosensitive elements can be disposed on the side of the display panel 1000 where the non-display surface is located, and the position of the photosensitive elements corresponds to the area on the display panel 1000 where the above-mentioned pixel structure is provided. The photosensitive element can be an image acquisition device for acquiring external image information, wherein the photosensitive element is an image acquisition device in the form of a Complementary Metal Oxide Semiconductor (CMOS), a Charge-coupled Device (CCD), etc. . . . . It can be understood that the photosensitive element may not be limited to an image acquisition device, for example, in some embodiments, the photosensitive element may also be an optical information acquisition device such as a fingerprint identification device, an infrared sensor, a proximity sensor and other light sensors.

By integrating the photosensitive elements on the side of the display panel 1000 where the non-display surface is located to realize the under-screen integration of the photosensitive elements of the image capture device, and meanwhile enabling the display panel 1000 still displaying images in the area where the photosensitive elements are integrated, a full screen design of the display panel 1000 can be achieved.

According to the above-mentioned embodiments of the present application, these embodiments do not describe all details exhaustively, nor do they limit the application to only the specific embodiments described. Obviously, according to the above description, many modifications and changes can be made. This specification selects and describes these embodiments in details, in order to better explain principles and practical applications of this application, such that those skilled in the art can make good use of this application and make modifications on the basis of this application. This application is only limited by the claims and their full scope and equivalents.

What is claimed is:

1. A pixel structure, comprising:
 a plurality of repeating units arranged repeatedly, each of the repeating units comprising a first sub-pixel, a second sub-pixel, a third sub-pixel and a fourth sub-pixel, wherein the first sub-pixel, the second sub-pixel, the third sub-pixel and the fourth sub-pixel are adjacent to each other in sequence, wherein a center of the first sub-pixel and a center of the second sub-pixel are connected by an imagined first center connection line, the center of the second sub-pixel and a center of the third sub-pixel are connected by an imagined second center connection line, and the center of the third sub-pixel and a center of the fourth sub-pixel are connected by an imagined third center connection line, the imagined first center connection line and the imagined third center connection line are located on one side of the imagined second center connection line, a minimum distance between the first sub-pixel and the fourth sub-pixel is greater than a minimum distance between the second sub-pixel and the third sub-pixel, the imagined second center connection line is parallel to a first direction, the first sub-pixel and the fourth sub-pixel are located on the same side of the second sub-pixel and the third sub-pixel along a second direction, the plurality of the repeating units is arranged along the second direction to form a pixel column, in each pixel column of the plurality of pixel columns, the second sub-pixel of one repeating unit is arranged adjacent to the first sub-pixel of a previous repeating unit of the one repeating unit, the third sub-pixel of the one repeating unit is arranged adjacent to the fourth sub-pixel of the previous repeating unit, a distance between the center of the second sub-pixel of the one repeating unit and the center of the first sub-pixel of the previous repeating unit in a direction parallel to the second direction is a first distance, and, in each of the repeating units, a distance between the center of the second sub-pixel and the center of the first sub-pixel in a direction parallel to the second direction is a second distance, and the first distance is less than or equal to twice the second distance; and
 a light-transmitting portion located between adjacent repeating units.

2. The pixel structure of claim 1, wherein the first sub-pixel, the second sub-pixel, the third sub-pixel, and the fourth sub-pixel are arranged to form an axisymmetric semi-enclosed structure.

3. The pixel structure of claim 1, wherein the first sub-pixel, the second sub-pixel, the third sub-pixel, and the fourth sub-pixel are sequentially arranged to form a C-shaped semi-enclosed structure.

4. The pixel structure of claim 1, wherein the second direction is perpendicular to the first direction, and an acute angle formed between the imagined first center connection line and the first direction is equal to an acute angle formed between the imagined third center connection line and the first direction.

5. The pixel structure of claim 4, wherein a plurality of the pixel columns is arranged along the first direction, and the light-transmitting portion comprises:
 a first sub-light transmitting portion located between every adjacent repeating unit of the plurality of repeating units in a same pixel column;
 a second sub-light transmitting portion located between adjacent pixel columns of the plurality of the pixel columns.

6. The pixel structure of claim 5, wherein, in each pixel column of the plurality of pixel columns, the adjacent repeating units of the plurality of repeating units are spaced apart from each other.

7. The pixel structure of claim 5, wherein adjacent pixel columns of the plurality of pixel columns are spaced apart from each other.

8. The pixel structure of claim 5, wherein, in each pixel column of the plurality of pixel columns, the adjacent repeating units are connected to each other, in every two adjacent repeating units in the pixel column, the second sub-pixel of one repeating unit is arranged adjacent to the first sub-pixel of the other repeating unit, and the third sub-pixel of the one repeating unit is disposed adjacent to the fourth sub-pixel of the other repeating unit.

9. The pixel structure of claim 5, wherein the adjacent pixel columns are connected to each other, and, in every two adjacent pixel columns, the first sub-pixel of one pixel column is arranged adjacent to the fourth sub-pixel of the other pixel column.

10. The pixel structure of claim 1, wherein the first sub-pixel, the second sub-pixel, the third sub-pixel, and the fourth sub-pixel have the same shape.

11. The pixel structure of claim 1, wherein the second sub-pixel and the third sub-pixel have the same color, the first sub-pixel, the second sub-pixel, and the fourth sub-pixel have different colors from each other, the second sub-pixel and the third sub-pixel are both green sub-pixels, either the first sub-pixel or the fourth sub-pixel is a red sub-pixel, and either the first sub-pixel or the fourth sub-pixel is a blue sub-pixel.

12. A display panel comprising a pixel structure, the pixel structure comprising:

a plurality of repeating units arranged repeatedly, each of the repeating units comprising a first sub-pixel, a second sub-pixel, a third sub-pixel and a fourth sub-pixel, wherein the first sub-pixel, the second sub-pixel, the third sub-pixel and the fourth sub-pixel are adjacent to each other in sequence, wherein a center of the first sub-pixel and a center of the second sub-pixel are connected by an imagined first center connection line, the center of the second sub-pixel and a center of the third sub-pixel are connected by an imagined second center connection line, and the center of the third sub-pixel and a center of the fourth sub-pixel are connected by an imagined third center connection line, the imagined first center connection line and the imagined third center connection line are located on one side of the imagined second center connection line, a minimum distance between the first sub-pixel and the fourth sub-pixel is greater than a minimum distance between the second sub-pixel and the third sub-pixel, the imagined second center connection line is parallel to a first direction, the plurality of the repeating units is arranged along the second direction to form a pixel column, in every two adjacent pixel columns, the first sub-pixel of one pixel column is arranged adjacent to the fourth sub-pixel of the other pixel column, for the first sub-pixel and the fourth sub-pixel that are adjacent to each other in the adjacent pixel columns, a distance between the center of the first sub-pixel and the center of the fourth sub-pixel in a direction parallel to the first direction is a third distance, and, in each of the repeating units, a distance between the center of the first sub-pixel and the center of the fourth sub-pixel in a direction parallel to the first direction is a fourth distance, and the third distance is less than or equal to the fourth distance; and a light-transmitting portion located between adjacent repeating units.

* * * * *